United States Patent
Huang et al.

(10) Patent No.: US 11,126,560 B2
(45) Date of Patent: Sep. 21, 2021

(54) SYSTEM-ON-CHIP MODULE FOR AVOIDING REDUNDANT MEMORY ACCESS

(71) Applicant: Syntronix Corporation, Hsinchu (TW)

(72) Inventors: Chong Jen Huang, Hsinchu (TW); Yung Cheng Su, Hsinchu (TW)

(73) Assignee: SYNTRONIX CORPORATION, Hsinchu (TW)

( * ) Notice: Subject to any disclaimer, the term of this patent is extended or adjusted under 35 U.S.C. 154(b) by 0 days.

(21) Appl. No.: 16/867,758

(22) Filed: May 6, 2020

(65) Prior Publication Data

US 2021/0165740 A1 Jun. 3, 2021

(30) Foreign Application Priority Data

Dec. 3, 2019 (TW) ................................. 108144004

(51) Int. Cl.
*G06F 13/00* (2006.01)
*G06F 12/0893* (2016.01)
*G11C 11/4096* (2006.01)
*G06F 13/40* (2006.01)

(52) U.S. Cl.
CPC ...... *G06F 12/0893* (2013.01); *G06F 13/4068* (2013.01); *G11C 11/4096* (2013.01); *G06F 2212/1041* (2013.01)

(58) Field of Classification Search
CPC ............ G06F 12/0893; G06F 13/4068; G06F 2212/1041; G11C 11/4096
See application file for complete search history.

(56) References Cited

U.S. PATENT DOCUMENTS

| | | | | |
|---|---|---|---|---|
| 2015/0243200 | A1* | 8/2015 | Pan | H04N 19/172 345/590 |
| 2015/0339237 | A1* | 11/2015 | Heddes | G06F 12/0875 711/137 |
| 2015/0347287 | A1* | 12/2015 | Tripathi | G11C 11/40615 711/154 |
| 2015/0362980 | A1* | 12/2015 | Tripathi | G06F 1/3287 713/324 |

(Continued)

FOREIGN PATENT DOCUMENTS

| CN | 101504633 A | * | 8/2009 |
|---|---|---|---|
| JP | H09282221 A | | 10/1997 |

(Continued)

*Primary Examiner* — Jing-Yih Shyu
(74) *Attorney, Agent, or Firm* — Muncy, Geissler, Olds & Lowe, P.C.

(57) ABSTRACT

A system-on-chip module for avoiding redundant memory access is provided, comprising at least one microprocessor, a DRAM and a DRAM controller. The DRAM and the microprocessor are integrated and formed in the system-on-chip module commonly. The DRAM controller is electrically connected between the DRAM and the microprocessor, and includes at least one column cache unit such that each microprocessor is able to perform read or write command to the DRAM through its corresponding column cache unit. Compared with the prior arts, the present invention is beneficial to provide better data access quality, efficiency and lower cost and complexity of the system architecture. Thus, the present invention is believed to be applied widely and having greater industrial applicability.

9 Claims, 5 Drawing Sheets

(56) References Cited

U.S. PATENT DOCUMENTS

| | | | |
|---|---|---|---|
| 2016/0049207 A1* | 2/2016 | Gulati | G11C 7/20 |
| | | | 365/96 |
| 2016/0055102 A1* | 2/2016 | de Cesare | G06F 21/00 |
| | | | 713/193 |
| 2016/0077579 A1* | 3/2016 | Gulati | G06F 1/206 |
| | | | 713/323 |
| 2016/0358584 A1* | 12/2016 | Greenebaum | G06T 11/001 |
| 2017/0140809 A1* | 5/2017 | Mozak | G06F 13/1684 |
| 2017/0285976 A1* | 10/2017 | Durham | G06F 12/1408 |
| 2020/0349046 A1* | 11/2020 | Holland | H03K 3/3565 |
| 2020/0379926 A1* | 12/2020 | Gopalakrishnan | |
| | | | G11C 11/4096 |

FOREIGN PATENT DOCUMENTS

| | | |
|---|---|---|
| JP | 2003044354 A | 2/2003 |
| JP | 2004171209 A | 6/2004 |

\* cited by examiner

SYSTEM-ON-CHIP MODULE FOR AVOIDING REDUNDANT MEMORY ACCESS

This application claims priority for Taiwan patent application no. 108144004 filed on 3 Dec. 2019, the content of which is incorporated by reference in its entirely.

BACKGROUND OF THE INVENTION

Field of the Invention

The present invention is related to a system-on-chip (SOC) module. More particularly, it is related to a system-on-chip (SOC) module, in which a column cache unit is correspondingly configured in the DRAM controller so as to effectively avoid redundant memory access while in operations.

Description of the Related Art

As known, Dynamic Random Access Memory (DRAM) is a certain type of semiconductor memory, which employs the amount of charges stored in the capacitor to represent a binary bit, "1" or "0". Since the transistor being used usually encounters inevitable leakage current problems when being practically applied, the amount of charges stored in the capacitor is not accurate enough for determination. Therefore, for dynamic random access memories, periodically charging is necessary. And owing to such repeatedly periodically refreshing process ongoing, DRAM is so called a "dynamic" memory. On the contrary, as long as the data is stored in a "Static" Random Access Memory (SRAM), it will not be lost even without the refreshing process.

It is known that compared with SRAM, DRAM is advantageous of simpler structure and lower complexity because it only requires one capacitor and one transistor to process data for each binary bit. On account of such feature, DRAM is capable of providing intense density and high capacity per unit volume, thus lowering its fabrication cost. However, on the other hand, DRAM also has its drawbacks, including slow access rate, large power consumption, and so on. Please find FIG. 1, which schematically shows a system architecture diagram of a conventional system-on-chip having data transmission with a dynamic random access memory in the prior art. As shown in FIG. 1, when a system-on-chip (SOC) 10 is transmitting data to the DRAM chip 12, a processor 11 stores the data into the SRAM 13 in the SOC 10 first, and then transmits the data stored in the SRAM 13 to the DRAM chip 12 through a DRAM control unit 15 and its standard interface 20 in a block transfer manner.

Similarly, when the processor 11 is reading data from the DRAM chip 12, the DRAM chip 12 must transmit the data to the SRAM 13 first before transmitting it to the processor 11. However, it draws our attention that, for a low-level or middle-level processor, a bus width of its system bus 30 is usually narrower than that of its data bus of the DRAM chip 12, i.e. the bus width of the standard interface 20. This means, when the processor 11 needs to execute programs directly on the DRAM, improper interfaces and operations will cause redundant DRAM accesses, and result in unnecessary delays. For example, when the processor 11 would like to access a bus width of 32-bit data from the SRAM 13, and yet the data is not stored in the SRAM 13, but in the DRAM chip 12, then a request to the DRAM chip 12 must be made through the DRAM control unit 15 and its standard interface 20. Moreover, it is believed that each request usually takes no less than 32 bits, for example, accessing a whole block of data. That's say if the processor 11 has fetched and executed one data and needs to fetch a next data, which is not stored in the SRAM 13, then, what happens is that, the DRAM control unit 15 must transfer another block of data again, and thus causing redundant DRAM accesses.

Therefore, based on the prior arts as discussed above, it should be apparent and obvious that there is indeed an urgent need for the professionals in the field for a novel and inventive modified SOC module to be developed, which can effectively solve those above mentioned problems occurring in the prior design and prosperously avoid the redundant DRAM access issues.

SUMMARY OF THE INVENTION

In order to overcome the above mentioned disadvantages of the prior arts, one major objective in accordance with the present invention is to provide a system-on-chip (SOC) module which is aimed for reducing additional DRAM fetch. Compared with the prior arts, the proposed SOC architecture module is beneficial to provide better data access quality, efficiency and meanwhile decrease its systematic architecture complexity and fabrication cost.

Another objective in accordance with the present invention is to provide a system-on-chip (SOC) module for avoiding redundant memory access, in which at least one column cache unit is configured in the DRAM controller such that a microprocessor is able to directly fetch the DRAM through the column cache unit without going through a traditional SRAM. By such arrangement, its data access rate can still quite approximate to the conventional one, and yet the cost and complexity of the present invention's system architecture is greatly reduced and improved.

One another objective in accordance with the present invention is to provide a system-on-chip (SOC) architecture module in which the DRAM and the microprocessor can be integrated and formed in a single chip commonly. Through the same logic and analog circuit process, the DRAM and the microprocessor are effectively integrated and thus enhance its industrial applicability than ever.

In view of the above many objectives of the invention, the present invention is aimed to disclose a system-on-chip module for avoiding redundant memory access, which comprises at least one microprocessor, a dynamic random access memory and a dynamic random access memory controller. The dynamic random access memory and the at least one microprocessor are integrated and formed in the system-on-chip module commonly. The dynamic random access memory controller is electrically connected between the at least one microprocessor and the dynamic random access memory, and includes at least one column cache unit. The at least one column cache unit is disposed correspondingly to the at least one microprocessor, such that the microprocessor is able to perform read or write command to the dynamic random access memory through the corresponding column cache unit.

According to one embodiment of the present invention, when the system-on-chip module comprises a plurality of the microprocessors, then the dynamic random access memory controller correspondingly comprises a plurality of the column cache units, such that each column cache unit is disposed correspondingly to each microprocessor. In such an embodiment, the dynamic random access memory controller further comprises an arbitrator unit, which is electrically connected to each of the column cache units, so as to decide either one of the microprocessors is able to perform the read or write command to the dynamic random access memory.

As such, when the microprocessor is about to read the dynamic random access memory and a data stored in the column cache unit is not its previously read data, then, the microprocessor instructs the dynamic random access memory controller to read a new data from the dynamic random access memory and stores the new data in the column cache unit for the microprocessor to read. Meanwhile, the microprocessor simultaneously labels a read address for the new data.

In another aspect, when the microprocessor is about to write a data into the dynamic random access memory and an address of the data is the same as an address of its previous data, the microprocessor stores the data into the column cache unit and write the data into the dynamic random access memory.

And if the address of the data is not the same as the address of its previous data, then the microprocessor reads the dynamic random access memory first and after the read command is complete, the microprocessor stores the data into the column cache unit for writing into the dynamic random access memory.

As a result, on account of the technical solution provided by the present invention, the current microprocessors are able to process with the address of each data individually without awaiting a whole block transfer of data as employed in the prior arts. It is believe that, apparently, the present invention effectively solves those conventional problems of redundant memory access arising from the prior technology.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE INVENTION

Figure 1:
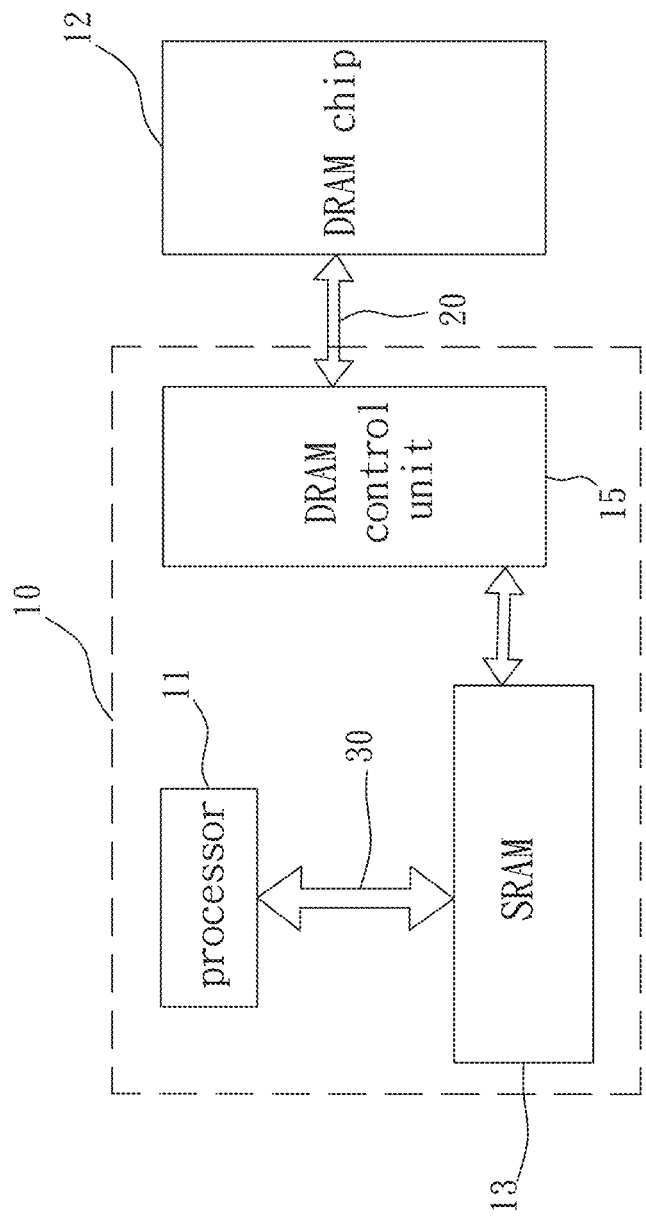
FIG. 1 schematically shows a system architecture diagram of a conventional system-on-chip having data transmission with a dynamic random access memory in the prior art.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

In order to effectively solve the issues mentioned in the prior art, so the system bus having a narrow bus width can avoid redundant DRAM access during data fetch operations, the present invention is aimed to provide an improved design, which is a system-on-chip module for avoiding redundant memory access. For a better understanding of the technical contents of the present invention, please refer to FIG. 2 first, which schematically illustrates a system architecture diagram in accordance with one embodiment of the present invention. Detailed descriptions thereof will be provided as follows.

Figure 2:
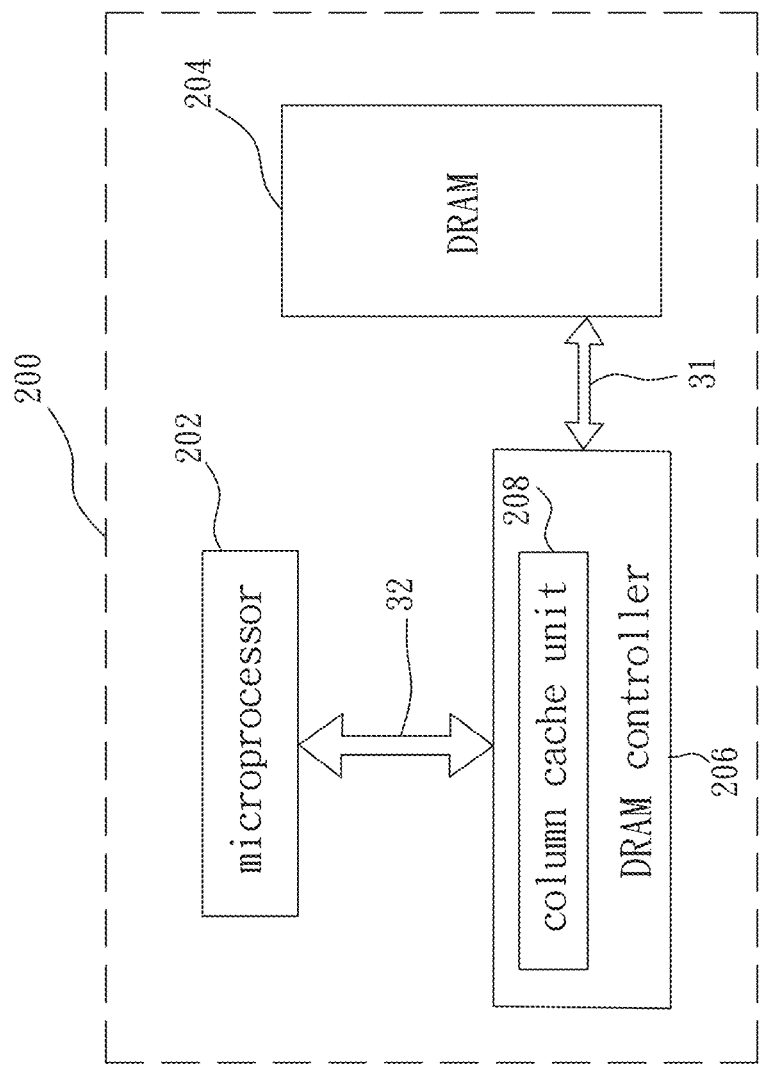
FIG. 2 schematically shows a system architecture diagram of a system-on-chip (SOC) module for avoiding redundant memory access in accordance with one embodiment of the present invention.

Please refer to FIG. 2. The present invention discloses a system-on-chip (SOC) module 200, which comprises a microprocessor 202, a DRAM (Dynamic Random Access Memory) 204 and a DRAM controller 206. The DRAM controller 206 is electrically connected between the microprocessor 202 and the DRAM 204, and includes at least one column cache unit 208. Generally, a System-on-chip (SOC) stands for a complete computer system, including a central processing unit (CPU), memory, graphics processor, and a plurality of peripheral circuits, which are all installed on a single chip. In other words, the circuit design of each unit is minimized and modularized, such that all their functions can be integrated into one IC. According to the embodiment of the present invention, through a same logic and analog circuit process, the microprocessor 202 and the DRAM 204 are integrated and formed in the system-on-chip (SOC) module 200 commonly.

To be specific, a first bus interface 31 is connected between the DRAM 204 and the DRAM controller 206 of the present invention. A second bus interface 32 is connected between the microprocessor 202 and the DRAM controller 206. Taking one embodiment of the present invention as an example, a bus width of the first bus interface 31 is, for example, 128 bit, and a bus width of the second bus interface 32 is, for example, 32 bit. Regarding a practical application, the bus width of the second bus interface 32 is usually narrower than the bus width of the first bus interface 31.

According to the embodiment of the present invention, the column cache unit 208 is disposed correspondingly to the microprocessor 202. As such, compared to the prior arts, the microprocessor 202 disclosed by the present invention is able to perform read or write command to the DRAM 204 through its corresponding column cache unit 208 without awaiting a whole block transfer of data.

In the following, the present invention provides more detailed descriptions and explanations regarding how the microprocessor is able to perform such read or write command to the DRAM. Please refer the following for the details.

Figure 3:
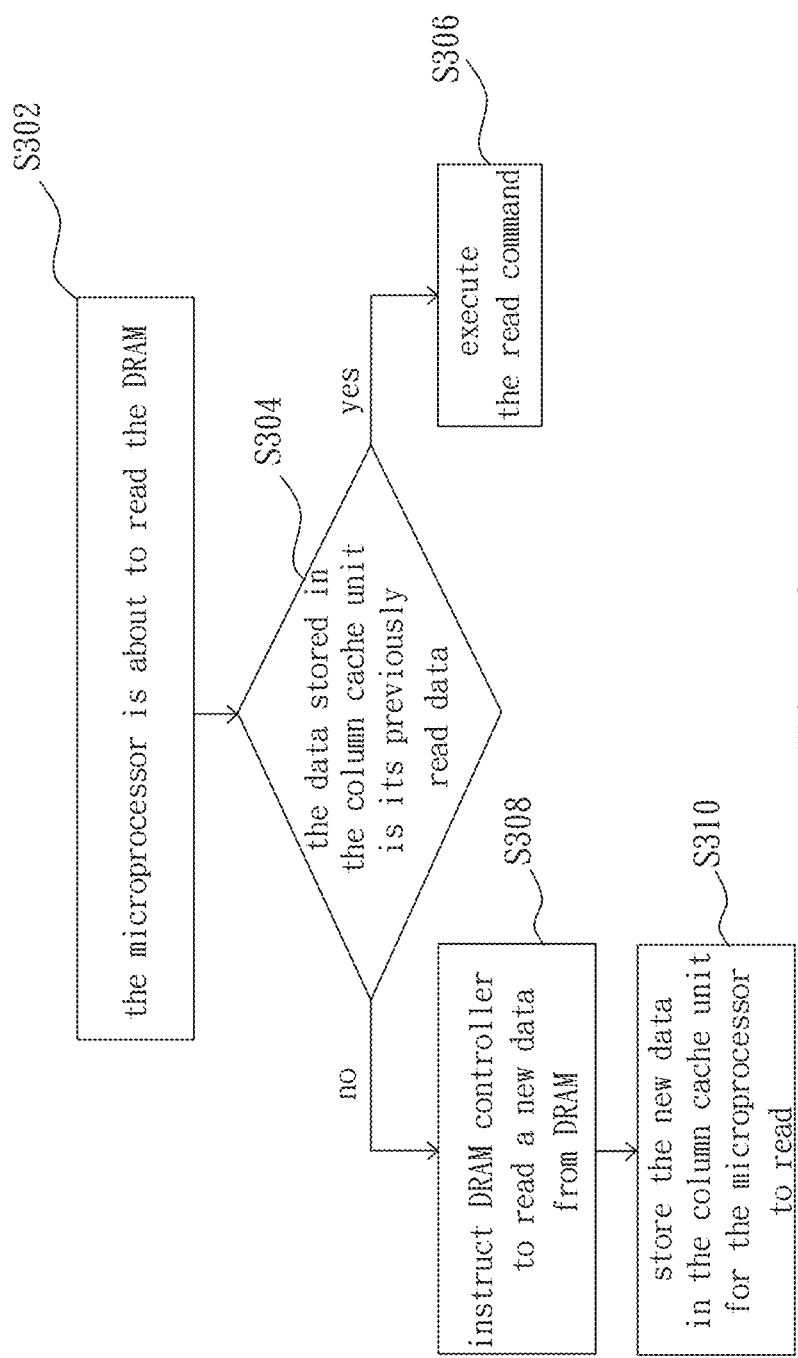
FIG. 3 shows a flow chart of the system-on-chip (SOC) module as indicated in FIG. 2 for performing a read command in accordance with the embodiment of the present invention.

At first, Start with FIG. 3 which shows a flow chart of the system-on-chip (SOC) module performing a read command in accordance with the embodiment of the present invention. Please refer to the system architecture diagram as illustrated in FIG. 2 at the same time. As shown in these figures, when the microprocessor 202 is about to read the DRAM 204 (as shown in step S302), it is determined whether the data stored in the column cache unit 208 is its previously read data (as shown in step S304). If yes, then the read command is executed directly as shown in step S306; otherwise, if it is determined in step S304 that the data stored in the column cache unit 208 is not its previously read data, then step S308 is performed, so the microprocessor 202 instructs the DRAM controller 206 to read a new data from the DRAM 204 first. And afterwards, as referring to step S310, the new data will be stored in the column cache unit 208 for the microprocessor 202 to read. According to the embodiment of the present invention, the microprocessor 202, at the same time, can simultaneously label a read address for the new data.

Figure 4:
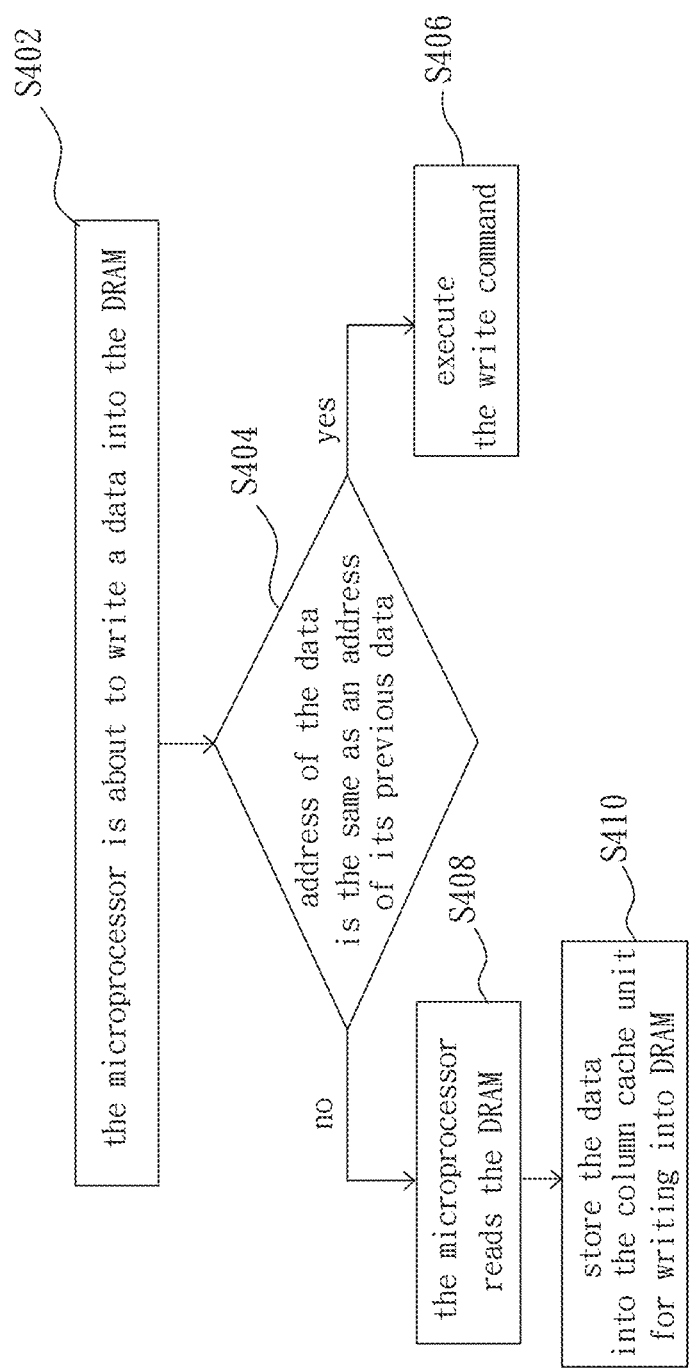
FIG. 4 shows a flow chart of the system-on-chip (SOC) module as indicated in FIG. 2 for performing a write command in accordance with the embodiment of the present invention.

In another aspect, FIG. 4 shows a flow chart of the system-on-chip (SOC) module performing a write command in accordance with the embodiment of the present invention. Please refer to the system architecture diagram as illustrated in FIG. 2 at the same time. As shown in these figures, when the microprocessor 202 is about to write a data into the DRAM 204 (as shown in step S402), it is determined in step S404, whether the address of the data is the same as an address of its previous data. If yes, then the write command is executed directly as shown in step S406. That is, storing the data into the column cache unit 208. Then, write it into the DRAM 204. Otherwise, if it is determined in step S404 that the address of the data is not the same as the address of its previous data, then step S408 is performed, so the microprocessor 202 reads the DRAM 204 first and after the read command is complete, store the data into the column cache unit 208 for writing into the DRAM 204, as shown in step S410.

For instance, when a bus width of the first bus interface 31 is 128 bit, and a bus width of the second bus interface 32 is 32 bit, it means, it takes 128 bit for each write command to the DRAM 204 without additional write coverage. Therefore, it is necessary to perform read-update-and then-write operation first, when the 32 bit data out of the 128 bits are needed to be updated, which explains why the steps S408 and S410 are employed in FIG. 4 of the present invention.

As a result, to sum up, when the system-on-chip (SOC) module disclosed in the present invention is applied, the microprocessor is able to perform write or read commands to the dynamic random access memory (DRAM) through the column cache unit. Under such circumstance, the microprocessor is able to process with the address of each data individually without awaiting a whole block transfer of data as mentioned in the prior arts. Therefore, it is apparent that the present invention is not only able to effectively reduce redundant DRAM operations, but also solve the conventional cache miss problems successfully.

Furthermore, compared with the traditional static random access memory, since the production cost, control circuit, and production area of the column cache unit proposed by the present invention are much more simplified and simpler, when applying the proposed column cache unit to the low-level or middle-level processor system, the objectives of reaching low cost, high efficiency, and accurate data access are accomplished. Meanwhile, since the processing rate of microprocessors in low-level or middle-level processor systems is usually slower than that of the dynamic random access memory, providing a technical solution that the microprocessor accesses DRAM directly through a column cache unit without using a traditional SRAM manner is practicable. And, its data access rate can still quite approximate to the rate in conventional manner, and does not cause a lot of difference.

Figure 5:
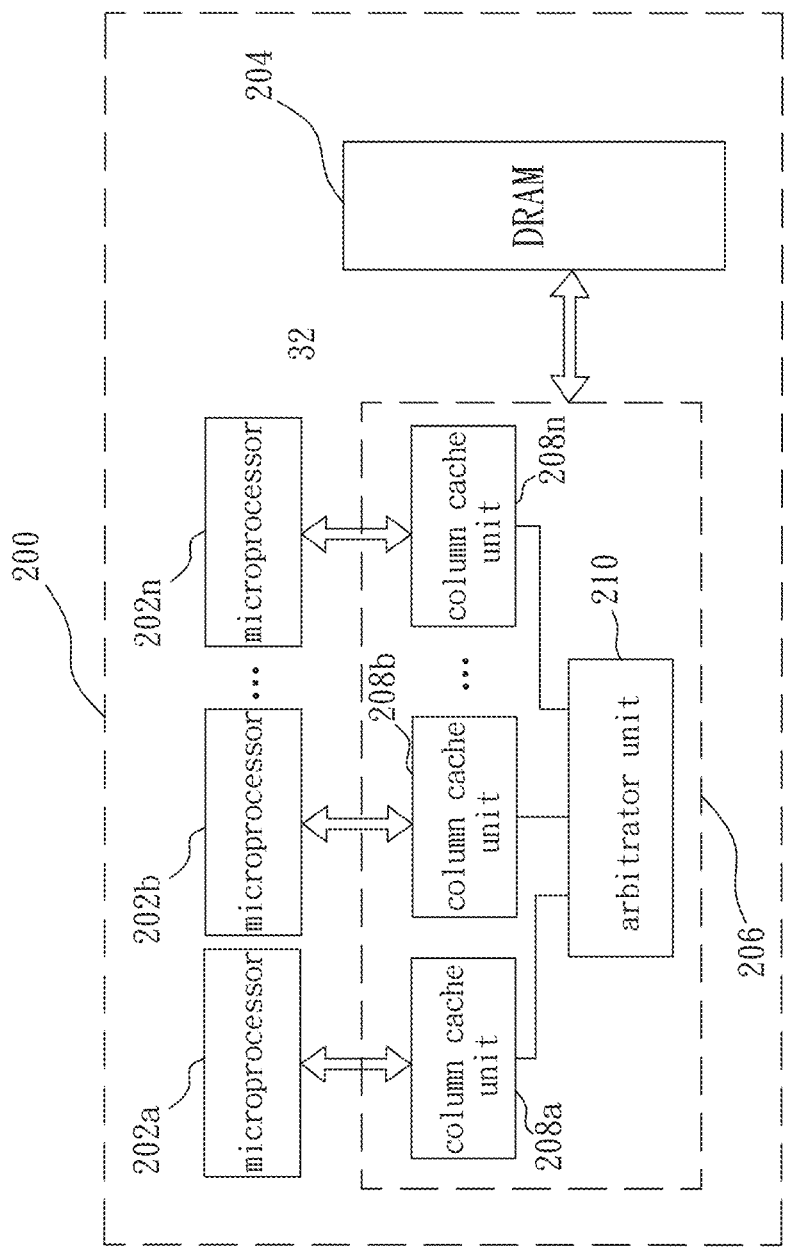
FIG. 5 schematically shows a system architecture diagram of a system-on-chip (SOC) module for avoiding redundant memory access which comprises a plurality of microprocessors, column cache units and an arbitrator unit in accordance with another embodiment of the present invention.

In another aspect, the technical contents disclosed by the present invention are not limited to the embodiment shown in FIG. 2. In other words, the system-on-chip (SOC) module disclosed in the present invention may alternatively comprise a plurality of microprocessors 202a, 202b, . . . 202n as indicated in the embodiment as shown in FIG. 5. In such embodiment, the DRAM controller 206 may correspondingly comprise a plurality of column cache units 208a, 208b, . . . 208n, such that each column cache unit 208a, 208b, . . . 208n is disposed correspondingly to each microprocessor 202a, 202b, . . . 202n. Under such circumstance, the DRAM controller 206 comprises an arbitrator unit 210, which is electrically connected to each column cache unit 208a, 208b, . . . 208n to decide either one of the microprocessors 202a, 202b, . . . 202n is able to perform the read or write command to the DRAM 204. And the steps for performing the read or write command are executed as referring to FIG. 3 and FIG. 4 of the present invention as discussed earlier in the detailed description of the invention.

Therefore, according to the technical contents and solutions proposed by the present invention, people having ordinary knowledge backgrounds and skilled in the art are allowed to vary their own design patterns depending on the actual implementation fields, nevertheless, which still fall into the scope of the present invention. The several illustrative embodiments of the present invention provided in the foregoing paragraphs are described to explain the main technical features of the present invention so well that those skilled in the art are able to understand and implement according to the present invention. The present invention is certainly not limited thereto these illustrative embodiments.

To sum up the above, it is obvious that, compared with the conventional prior arts, the novel system-on-chip (SOC) module disclosed in the present invention can effectively solve issues of additional memory access and long waiting time arising from the prior technology. The present invention is aimed for not only efficiently improving the quality and speed of data access, but also achieving the purposes of reducing production cost and complexity, thereby providing an optimizing effect of the invention. As a result, it is believed that the present invention is instinct, effective and highly competitive for recent technology and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A system-on-chip module for avoiding redundant memory access, comprising:

at least one microprocessor;

a dynamic random access memory, being integrated and formed in the system-on-chip module commonly with the at least one microprocessor; and a dynamic random access memory controller, being electrically connected between the at least one microprocessor and the dynamic random access memory, wherein the dynamic random access memory controller includes at least one column cache unit, the at least one column cache unit is disposed correspondingly to the at least one microprocessor, such that the at least one microprocessor performs read or write command to the dynamic random access memory through the corresponding column cache unit, and wherein a first bus interface is connected between the dynamic random access memory and the dynamic random access memory controller, a second bus interface is connected between the at least one microprocessor and the dynamic random access memory controller, and a bus width of the second bus interface is narrower than that of the first bus interface.

2. The system-on-chip module for avoiding redundant memory access according to claim 1, wherein the at least one microprocessor and the dynamic random access memory are integrated and formed in the system-on-chip module commonly through a same logic and analog circuit process.

3. The system-on-chip module for avoiding redundant memory access according to claim 1, wherein the system-on-chip module further comprises a plurality of the microprocessors, and the dynamic random access memory controller correspondingly comprises a plurality of the column cache units, such that each the column cache unit is disposed correspondingly to each the microprocessor.

4. The system-on-chip module for avoiding redundant memory access according to claim 3, wherein the dynamic random access memory controller further comprises an arbitrator unit, which is electrically connected to each the column cache unit, so as to decide either one of the microprocessors performs the read or write command to the dynamic random access memory.

5. The system-on-chip module for avoiding redundant memory access according to claim 1, wherein when the at least one microprocessor is about to read the dynamic random access memory and a data stored in the column cache unit is not its previously read data, the at least one microprocessor instructs the dynamic random access memory controller to read a new data from the dynamic random access memory and stores the new data in the column cache unit for the at least one microprocessor to read.

6. The system-on-chip module for avoiding redundant memory access according to claim 5, wherein the at least one microprocessor simultaneously labels a read address for the new data.

7. The system-on-chip module for avoiding redundant memory access according to claim 1, wherein when the at least one microprocessor is about to write a data into the dynamic random access memory and an address of the data is the same as an address of its previous data, the at least one microprocessor stores the data into the column cache unit and write the data into the dynamic random access memory.

8. The system-on-chip module for avoiding redundant memory access according to claim 7, wherein if the address of the data is not the same as the address of its previous data, the at least one microprocessor reads the dynamic random access memory first and after the read command is complete, stores the data into the column cache unit for writing into the dynamic random access memory.

9. The system-on-chip module for avoiding redundant memory access according to claim 1, wherein when the at least one microprocessor fetches the dynamic random access memory through the column cache unit, the at least one microprocessor processes with an address of each data individually without awaiting a whole block transfer of data.

* * * * *